(12) United States Patent
Cea et al.

(10) Patent No.: US 7,019,326 B2
(45) Date of Patent: Mar. 28, 2006

(54) TRANSISTOR WITH STRAIN-INDUCING STRUCTURE IN CHANNEL

(75) Inventors: Stephen M. Cea, Hillsboro, OR (US);
Ravindra Soman, Portland, OR (US);
Ramune Nagisetty, Portland, OR (US);
Sunit Tyagi, Portland, OR (US);
Sanjay Natarajan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/714,139

(22) Filed: Nov. 14, 2003

(65) Prior Publication Data

US 2005/0106792 A1    May 19, 2005

(51) Int. Cl.
*H01L 29/06* (2006.01)

(52) U.S. Cl. .............................. 257/19; 257/18; 257/15

(58) Field of Classification Search ............ 257/19–12, 257/190–192; 438/752–753, 602–607
See application file for complete search history.

(56) References Cited

U.S. PATENT DOCUMENTS

| 6,059,895 A | * | 5/2000 | Chu et al. | .................. 148/33.1 |
| 6,603,156 B1 | * | 8/2003 | Rim | ........................... 257/190 |
| 2004/0026765 A1 | * | 2/2004 | Currie et al. | ................ 257/616 |

* cited by examiner

*Primary Examiner*—Dung A. Le
(74) *Attorney, Agent, or Firm*—Blakely, Sokoloff, Taylor & Zafman LLP

(57) ABSTRACT

Various methods for forming a layer of strained silicon in a channel region of a device and devices constructed according to the disclosed methods. In one embodiment, a strain-inducing layer is formed, a relaxed layer is formed on the strain-inducing layer, a portion of the strain-inducing layer is removed, which allows the strain-inducing layer to relax and strain the relaxed layer.

15 Claims, 4 Drawing Sheets

TRANSISTOR WITH STRAIN-INDUCING STRUCTURE IN CHANNEL

FIELD

The embodiments disclosed herein relate generally to circuit processing.

BACKGROUND

The performance levels of various semiconductor devices, such as transistors, are at least partly dependent on the mobility of charge carriers (e.g., electrons and/or electron vacancies, which are also referred to as holes) through the semiconductor device. In a transistor, the mobility of the charge carriers through the channel region is particularly important.

Various techniques have been used to improve charge carrier mobility in semiconductor devices. For example, a nitride layer can be formed on the source/drain regions of semiconductor device to induce horizontal tensile stress in the channel region of the device, which can improve charge carrier mobility in an n-type metal oxide semiconductor ("NMOS") device. However, the amount of stress induced by the nitride layer is limited by the maximum intrinsic stress achievable by the nitride layer and the practical maximum thickness of the nitride layer.

Alternatively, a strained layer of silicon can be formed on a layer of relaxed silicon germanium in a channel region of an NMOS device. The term "strained" is used to describe a layer whose lattice structure of atoms is not typical for the material of which the layer is comprised. A layer of material (e.g., a first layer) can become strained when it is formed on a second layer of material with a different lattice structure (e.g., larger or smaller) than that of the first layer. A layer is "relaxed" when it has a lattice structure that is typical for the type of material of which the layer is comprised, in the absence of outside forces acting on the lattice.

The technique of forming strained silicon on relaxed silicon germanium (e.g., the silicon is strained by the larger size of the silicon germanium lattice) has the potential to induce a large amount of stress in the channel region of the NMOS device, which would yield large performance benefits. However, this technique requires formation of a large area of defect-free strained silicon, which is generally very difficult and expensive.

If the strained silicon layer has a high level of defects, the charge carrier mobility may be decreased through that layer of the device. For example, a dislocated charge carrier is a type of defect that may reduce charge carrier mobility by creating a local scatter area for the charge carriers, which can act as a leakage path that causes power loss through that section of the device.

DESCRIPTION OF THE DRAWINGS

Various embodiments are illustrated by way of example and not by way of limitation in the figures of the accompanying drawings in which like references indicate similar elements. It should be noted that references to "an," "one," "the," "other," "another," "alternative," or "various" embodiments in this disclosure are not necessarily to the same embodiment, and such references mean at least one.

DETAILED DESCRIPTION

The following description and the accompanying drawings provide examples for the purposes of illustration. However, these examples should not be construed in a limiting sense as they are not intended to provide an exhaustive list of all possible implementations.

Figure 1:
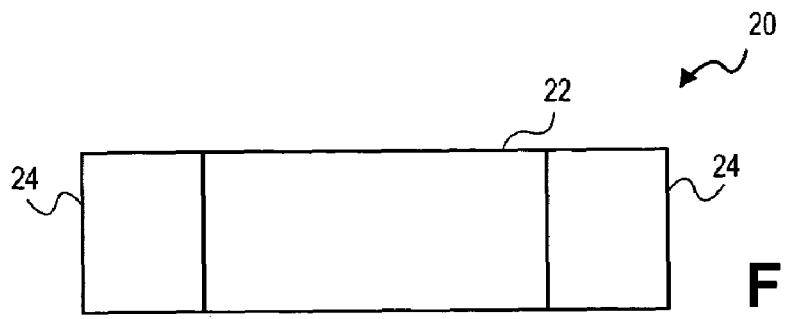
FIG. 1 shows a substrate with isolation trenches formed therein.

FIGS. 1–5 illustrate one embodiment of a method of forming a strained silicon layer in the channel region of a device. The device may be, for example, an NMOS device (e.g, transistor) or a p-type metal oxide semiconductor ("PMOS") device. FIG. 1 shows a portion of a circuit structure including device 20. Device 20 of FIG. 1 includes substrate 22 with isolation trenches 24 formed therein. Substrate 22 may be, for example, made of silicon.

Figure 2:
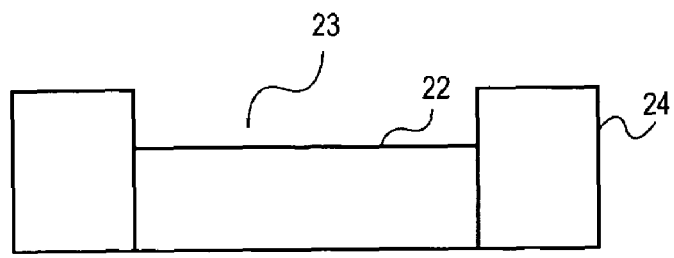
FIG. 2 shows the substrate of FIG. 1 with a portion of the substrate removed.
Figure 3:
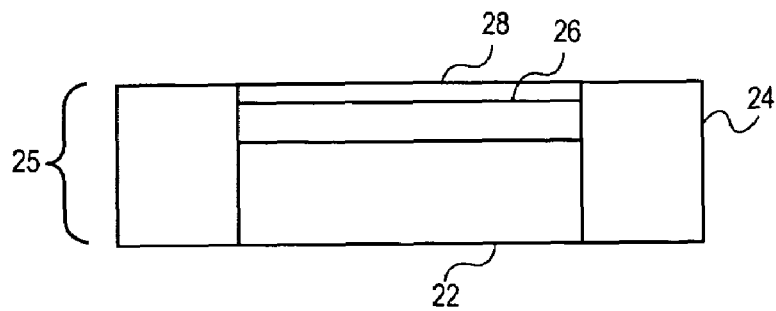
FIG. 3 shows the substrate of FIG. 2 with a strain-inducing layer and a relaxed layer formed in the recess created by removal of a portion of the substrate.

FIG. 2 shows substrate 22 with a portion of substrate 22 selectively removed (e.g., etched) to create recess 23. Strain-inducing layer 26 can then be selectively formed in recess 23 of substrate 22, as shown in FIG. 3. At this stage of device formation, strain-inducing layer 26 may be strained if strain-inducing layer 26 is formed on a substrate with a different lattice structure than that of strain-inducing layer 26 (e.g., silicon germanium or silicon carbide formed on a silicon substrate).

In various embodiments, strain-inducing layer 26 can be a layer of silicon germanium. In other embodiments, silicon carbide can be used as strain-inducing layer 26. In selecting the type of material for strain-inducing layer 26, one must consider, among-other factors, what type of strain is desired.

Silicon germanium can be used as strain-inducing layer 26 for applications in which a horizontal (e.g., as viewed) tensile strain is desired in the device (e.g., NMOS devices). The larger size of the silicon germanium lattice can strain (e.g., tensile strain) the smaller lattice of a silicon layer formed on the silicon germanium layer. Germanium may comprise between approximately 20 and 25 percent of the silicon germanium layer used as a strain-inducing layer. Although, other concentrations beyond this range could also be used.

The silicon germanium layer can have a thickness between approximately 400 and 500 Å. However, other thicknesses beyond this range may be used. By varying the concentration of germanium and the thickness of the silicon germanium layer relative to the layer to be strained (e.g., silicon), a desired level of strain can be induced in the layer to be strained. In general, greater strain is obtained with (i) a thicker strain-inducing layer relative to the layer to be strained and/or (ii) a greater concentration of germanium.

Alternatively, silicon carbide can be used as strain-inducing layer 26 for applications in which a horizontal (e.g., as viewed) compressive strain is desired in the device (e.g., PMOS devices). The smaller size of the silicon carbide lattice can strain (e.g., compressive strain) the larger lattice of a silicon layer formed on the silicon carbide layer. Carbide may comprise between approximately 1 and 2 percent of the silicon carbide layer used as a strain-inducing layer. Although, other concentrations beyond this range could also be used. The carbon content and thickness of the silicon carbide layer relative to the layer to be strained may be varied in order to achieve a desired level of strain. In general, greater strain is obtained with (i) a thicker strain-inducing layer relative to the layer to be strained and/or (ii) a greater concentration of carbon.

Returning now to FIG. 3, relaxed layer 28 is shown selectively formed on strain-inducing layer 26 within recess 23. Collectively, substrate 22, strain-inducing layer 26, and relaxed layer 28 form composite substrate 25. In various embodiments, relaxed layer 28 is formed of silicon in a relaxed state. Relaxed layer 28 (e.g., silicon) may be relaxed due to the fact that, at this point, strain-inducing layer 26 (e.g., silicon germanium) has a lattice structure approximately the same as substrate 22 (e.g., silicon).

If silicon is used for relaxed layer 28, the silicon can be formed to a thickness between approximately 100 and 200 Å. Of course, thicknesses beyond this range may be used for relaxed layer 28.

Figure 4:
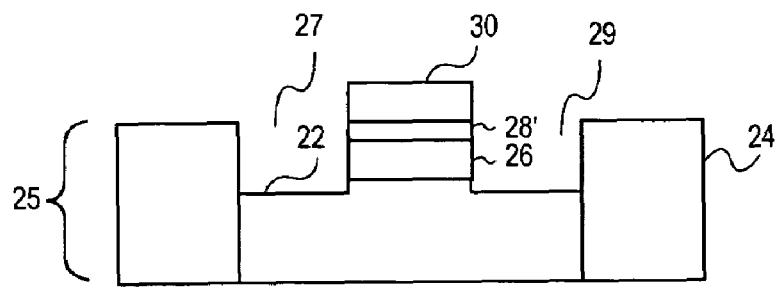
FIG. 4 shows the substrate of FIG. 3 with a gate electrode formed on the relaxed layer and a portion of the strain-inducing layer removed.

FIG. 4 shows gate electrode 30 formed on composite substrate 25 (e.g., over a gate dielectric). In various embodiments, first recess 27 and second recess 29 in composite substrate 25 are created by removing at least a portion of strain-inducing layer 26. In the embodiment shown, a portion of relaxed layer 28 is also removed. The free surface exposed by the creation of first recess 27 and second recess 29 allows strain-inducing layer 26 to expand (e.g., for a silicon germanium layer) or contract (e.g., for a silicon carbide layer) to the natural lattice structure for the material of which strain-inducing layer 26 is comprised.

Once the expansion or contraction of strain-inducing layer 26 occurs, strain-inducing layer 26 induces strain (e.g., tensile or compressive) upon relaxed layer 28. Once relaxed layer 28 is strained by strain-inducing layer 26, relaxed layer 28 becomes strained layer 28', with improved charge carrier mobility characteristics.

Figure 5:
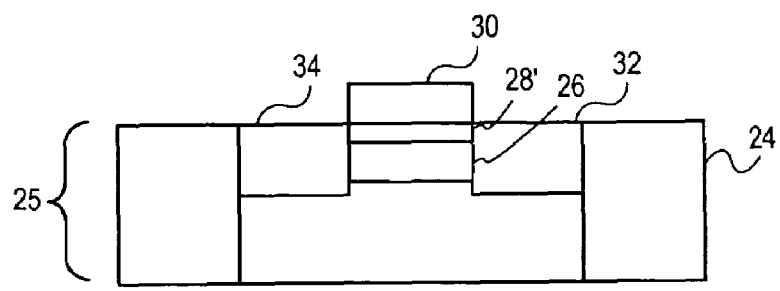
FIG. 5 shows the substrate of FIG. 4 with first and second source/drain regions formed in the areas where a portion of the strain-inducing layer was removed.

In the embodiment shown in FIG. 4, strain-inducing layer 26 and strained layer 28' are located in a channel region of device 20 beneath gate electrode 30. FIG. 5 shows device 20 in a completed state with first source/drain region 34 formed in first recess 27 and second source/drain region 32 formed in second recess 29.

Figure 6:
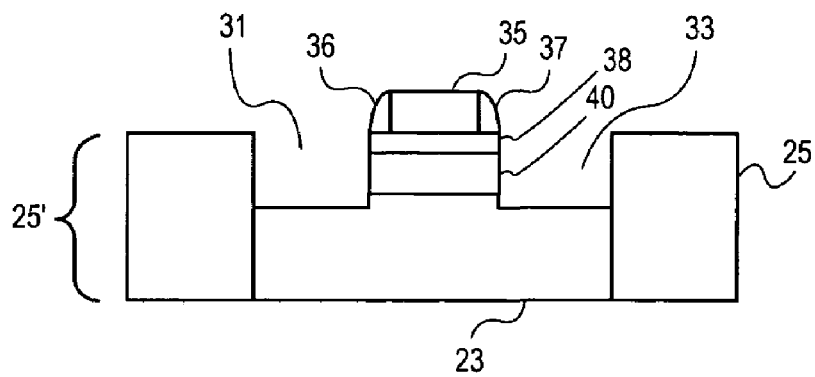
FIG. 6 shows an alternative embodiment in which a gate electrode and first and second spacers are formed on the relaxed layer of FIG. 3 and a portion of the strain-inducing layer is removed.
Figure 7:
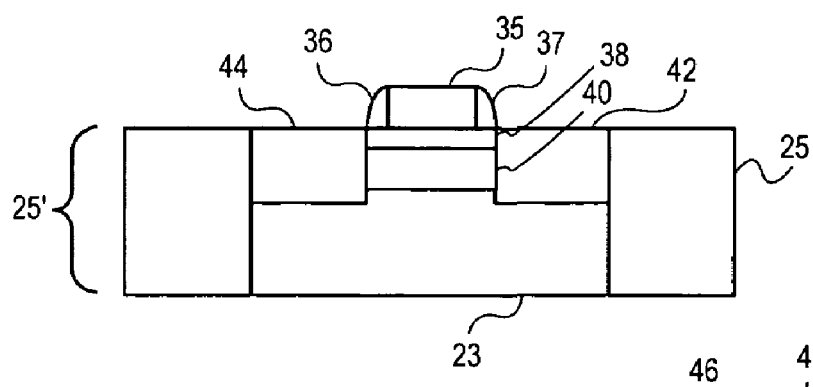
FIG. 7 shows the substrate of FIG. 6 with first and second source/drain regions formed in the areas where a portion of the strain-inducing layer was removed.

FIGS. 6 and 7 show an alternative embodiment that initially follows the same procedure as that shown in FIGS. 1–3. However, gate electrode 35 of FIG. 6 (e.g., formed on composite substrate 25') further includes first spacer 36 formed adjacent to a first side of gate electrode 35 and second spacer 37 formed adjacent to a second side of gate electrode 35.

In the embodiment shown, first recess 31 and second recess 33 in composite substrate 25' are created by removing at least a portion of the strain-inducing layer (e.g., layer 26 of FIG. 3). A portion of the relaxed layer (e.g., layer 28 of FIG. 3) can also be removed. The free surface exposed by the creation of first recess 31 and second recess 33 allows the strain-inducing layer to expand (e.g., for a silicon germanium layer) or contract (e.g., for a silicon carbide layer).

Once the expansion or contraction of the strain-inducing layer occurs, the strain-inducing layer induces strain (e.g., tensile or compressive) upon the relaxed layer. Once the relaxed layer is strained by strain-inducing layer 40, the relaxed layer becomes strained layer 38, with improved charge carrier mobility characteristics.

In the embodiment shown in FIG. 6, strain-inducing layer 40 and strained layer 38 are located in a channel region of the device beneath gate electrode 35 and first spacer 36 and second spacer 37. FIG. 7 shows the device in a completed state with first source/drain region 44 formed in first recess 31 and second source/drain region 42 formed in second recess 33.

Figure 8:
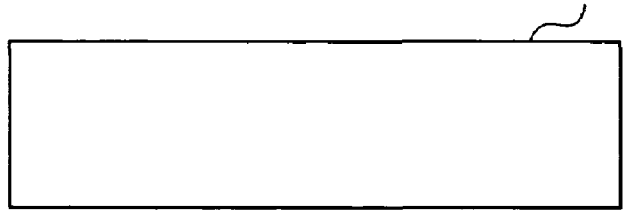
FIG. 8 shows a substrate suitable for blanket deposition of material thereon.

FIGS. 8–11 illustrate an alternative embodiment of a method of forming a strained silicon layer in the channel region of a device. The device may be, for example, an NMOS or a PMOS device. Device 45 of FIG. 8 is initially comprised of substrate 46. Substrate 46 may be, for example, made of silicon.

Figure 9:
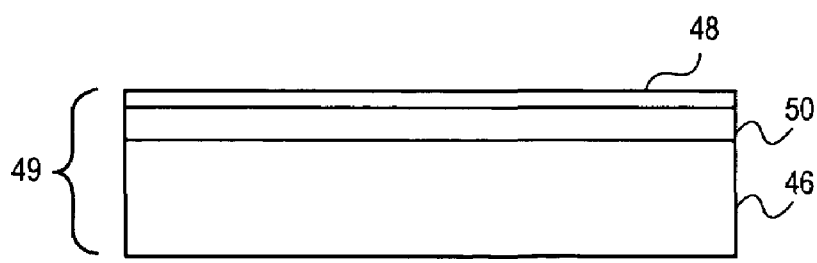
FIG. 9 shows the substrate of FIG. 8 with a strain-inducing layer and a relaxed layer formed on a surface of the substrate.

FIG. 9 shows blanket deposition of strain-inducing layer 50 on substrate 46. In various embodiments, strain-inducing layer 50 can be a layer of silicon germanium. In other embodiments, silicon carbide can be used as strain-inducing layer 50.

FIG. 9 also shows blanket deposition of relaxed layer 48 on strain-inducing layer 50. Collectively, substrate 46, strain-inducing layer 50, and relaxed layer 48 form composite substrate 49. In various embodiments, relaxed layer 48 is formed of silicon. If silicon is used for relaxed layer 48, the silicon can be formed to a thickness between approximately 100 and 200 Å. Of course, other thicknesses beyond this range may be used.

Figure 10:
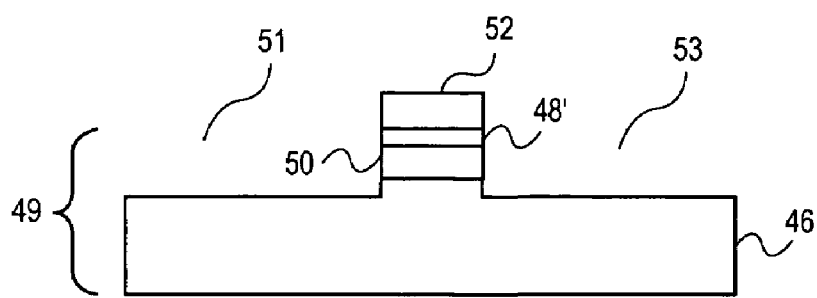
FIG. 10 shows the substrate of FIG. 9 with a gate electrode formed on the relaxed layer and a portion of the strain-inducing layer removed.

FIG. 10 shows gate electrode 52 formed on composite substrate 49. In various embodiments, first recess 51 and second recess 53 in composite substrate 49 are created by removing at least a portion of strain-inducing layer 50. In the embodiment shown, a portion of relaxed layer 48 is also removed. The free surface exposed by the creation of first recess 51 and second recess 53 allows strain-inducing layer 50 to expand (e.g., for a silicon germanium layer) or contract (e.g., for a silicon carbide layer).

Once the expansion or contraction of strain-inducing layer 50 occurs, strain-inducing layer 50 induces strain (e.g., tensile or compressive) upon relaxed layer 48. Once relaxed layer 48 is strained by strain-inducing layer 50, relaxed layer 48 becomes strained layer 48', with improved charge carrier mobility characteristics.

Figure 11:
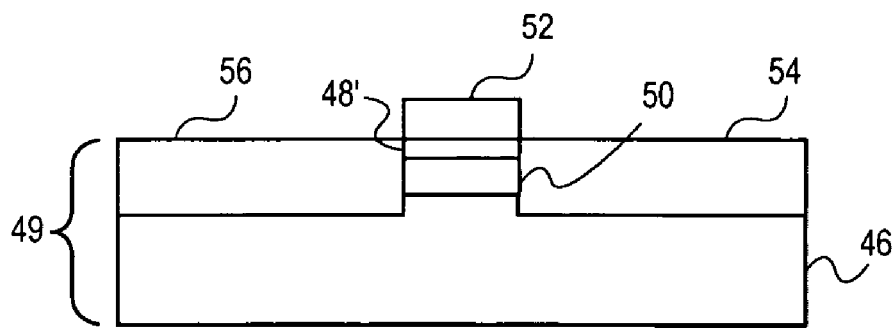
FIG. 11 shows the substrate of FIG. 10 with first and second source/drain regions formed in the areas where a portion of the strain-inducing layer was removed.

In the embodiment shown in FIG. 10, strain-inducing layer 50 and strained layer 48' are located in a channel region of device 45 beneath gate electrode 52. FIG. 11 shows device 45 in a completed state with first source/drain region 56 formed in first recess 51 and second source/drain region 54 formed in second recess 53.

Figure 12:
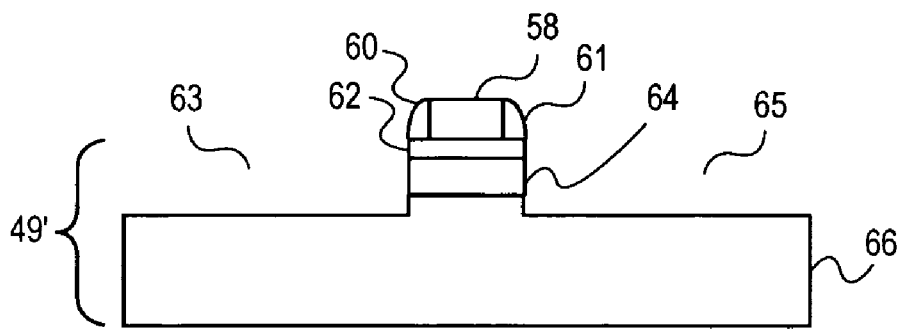
FIG. 12 shows an alternative embodiment in which a gate electrode and first and second spacers are formed on the relaxed layer of FIG. 9 and a portion of the strain-inducing layer is removed.
Figure 13:
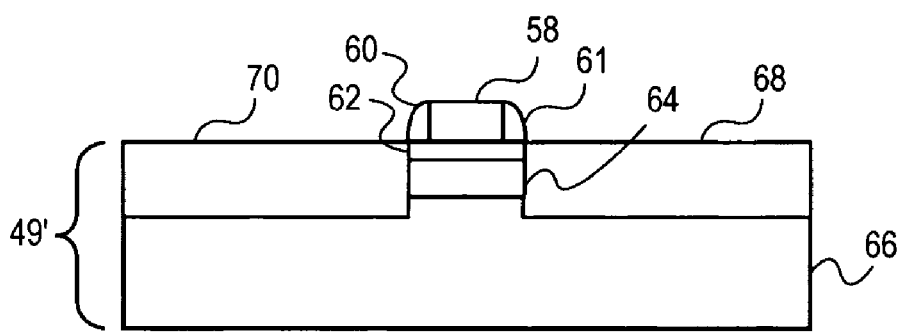
FIG. 13 shows the substrate of FIG. 12 with first and second source/drain regions formed in the areas where a portion of the strain-inducing layer was removed.

FIGS. 12 and 13 show an alternative embodiment that initially follows the same procedure as that shown in FIGS. 8 and 9. However, gate electrode 58 of FIG. 12 (e.g., formed on composite substrate 49') further includes first spacer 60 formed adjacent to a first side of gate electrode 58 and second spacer 61 formed adjacent to a second side of gate electrode 58.

In the embodiment shown, first recess 63 and second recess 65 in composite substrate 49' are created by removing at least a portion of the strain-inducing layer (e.g., layer 50 of FIG. 9). A portion of the relaxed layer (e.g., layer 48 of FIG. 9) can also be removed. The free surface exposed by the creation of first recess 63 and second recess 65 allows the strain-inducing layer to expand (e.g., for a silicon germanium layer) or contract (e.g., for a silicon carbide layer).

Once the expansion or contraction of the strain-inducing layer occurs, the strain-inducing layer induces strain (e.g., tensile or compressive) upon the relaxed layer. Once the relaxed layer is strained by strain-inducing layer 64, the relaxed layer becomes strained layer 62, with improved charge carrier mobility characteristics.

In the embodiment shown in FIG. 12, strain-inducing layer 64 and strained layer 62 are located in a channel region of the device beneath gate electrode 58 and first spacer 60 and second spacer 61. FIG. 13 shows the device in a completed state with first source/drain region 70 formed in first recess 63 and second source/drain region 68 formed in second recess 65.

Figure 14:
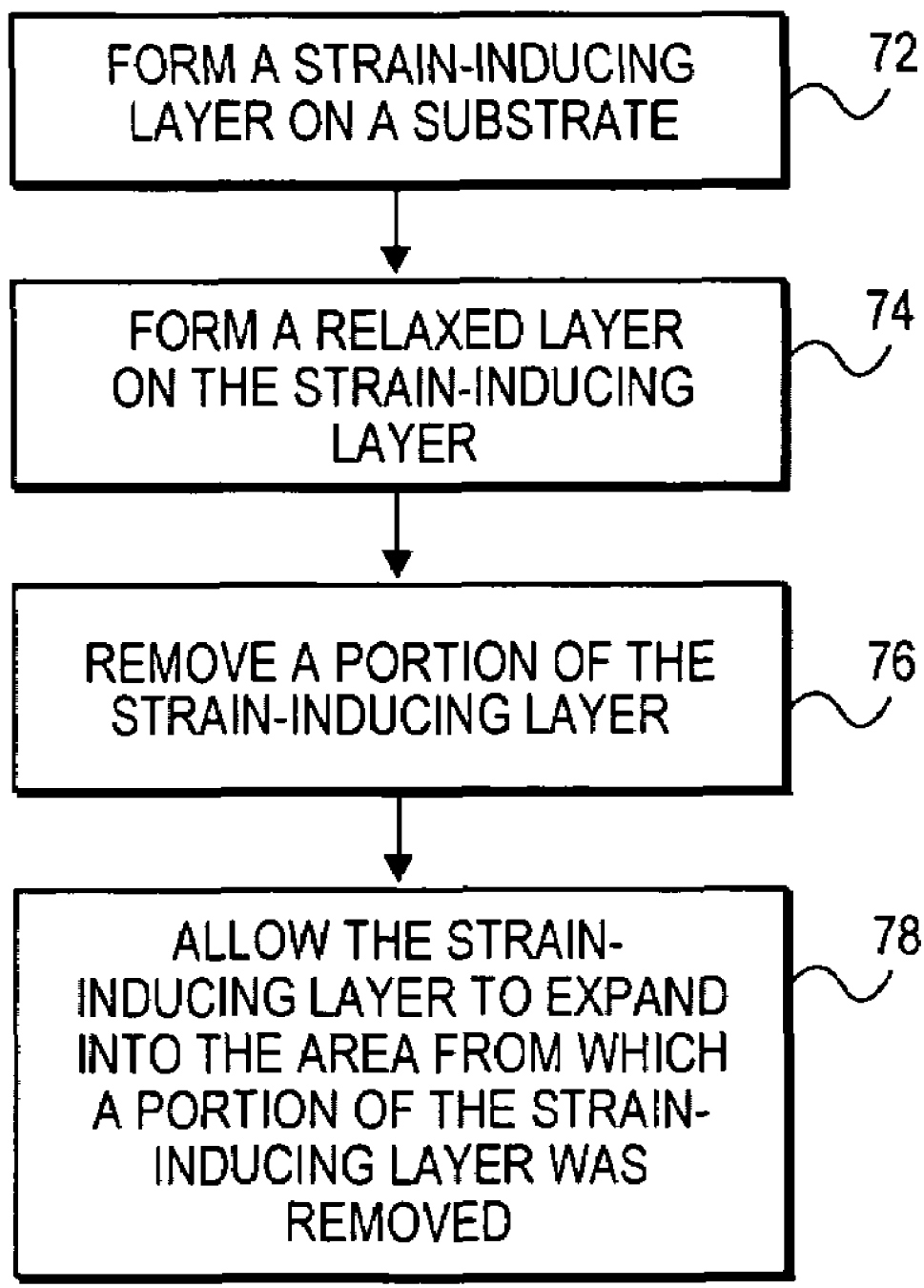
FIG. 14 shows one embodiment of a method for forming a device with a relaxed layer on a strain-inducing layer in order to strain the relaxed layer.

FIG. 14 shows a flow chart for a method of forming a device with a relaxed layer on a strain-inducing layer in order to strain the relaxed layer. At block 72, a strain-inducing layer is formed on a substrate such that the strain-inducing layer is strained by the substrate. As described above, the strain-inducing layer may be, for example, silicon germanium or silicon carbide, and the substrate may be silicon. A relaxed layer may be formed on the strain-inducing layer at block 74. The relaxed layer may, in one embodiment, be silicon.

At block 76, a portion of the strain-inducing layer is removed. In various embodiments, a portion of the relaxed layer is also removed. For example, the portion removed from both the strain-inducing layer and the relaxed layer may create recesses in which source/drain regions can be formed in a transistor.

Removal of a portion of the strain-inducing layer creates a free surface of the strain-inducing layer that allows the strain-inducing layer to expand or contract, depending on the composition of the strain-inducing layer. For example, a strain-inducing layer containing silicon germanium will expand, which can exert a horizontal tensile strain on the relaxed layer, at block 78. In an alternative embodiment, a strain-inducing layer containing silicon carbide will contract, which can exert a horizontal compressive strain on the relaxed layer.

The concentration of germanium or carbide in the strain-inducing layer may be varied in order to obtain a desired level of strain in the strained layer. The thickness of the relaxed layer relative to the strain-inducing layer may also be varied to obtain a desired level of strain in the relaxed layer.

It is to be understood that even though numerous characteristics and advantages of various embodiments have been set forth in the foregoing description, together with details of structure and function of the various embodiments, this disclosure is illustrative only. Changes may be made in detail, especially matters of structure and management of parts, without departing from the scope of the various embodiments as expressed by the broad general meaning of the terms of the appended claims.

We claim:

1. An apparatus comprising:
    a substrate comprising a first lattice structure;
    a strain-inducing layer disposed on the substrate having a second lattice structure different than the first lattice structure; and
    a strained layer disposed on the strain-inducing layer,
    wherein the strain-inducing layer and the strained layer are disposed in a channel region for a transistor device and the second lattice structure is defined by a lateral contraction or expansion of the strain-inducing layer,
    wherein when the strain-inducing layer comprises silicon germanium,
    germanium comprises between approximately 20 and 25 percent of the silicon germanium.

2. The apparatus of claim 1, further comprising:
    a gate electrode disposed on the strained layer;
    a first spacer disposed adjacent to a first side of the gate electrode; and
    a second spacer disposed adjacent to a second side of the gate electrode,
    wherein the stain-inducing layer and the strained layer comprises lateral edges defined by an edge of the first spacer and an edge of the second spacer.

3. The apparatus of claim 1, wherein the apparatus comprises:
    an n-type metal oxide semiconductor.

4. The apparatus of claim 3, wherein the strain-inducing layer comprises:
    silicon germanium.

5. The apparatus of claim 4, wherein the silicon germanium layer has a thickness of between approximately 400 and 500 Å.

6. The apparatus of claim 5, wherein the strained layer comprises silicon and has a thickness of between approximately 100 and 200 Å.

7. The apparatus of claim 1, wherein the apparatus comprises:
    a p-type metal oxide semiconductor.

8. The apparatus of claim 7, wherein the strain-inducing layer comprises:
    silicon carbide.

9. The apparatus of claim 8, wherein carbon comprises between approximately 1 and 2 percent of the silicon carbide.

10. A system comprising:
    an integrated circuit package comprising
        a substrate comprising a first lattice structure,
        a strain-inducing layer disposed on the substrate, the strain-inducing layer comprising a second lattice structure different than the first lattice structure, and
        a strained layer disposed on the strain-inducing layer,
    wherein the strain-inducing layer and the strained layer are disposed in a channel region for a transistor device and the second lattice structure is defined by a lateral contraction or expansion of the strain-inducing layer,
    wherein when the strain-inducing layer comprises silicon germanium,
    germanium comprises between approximately 20 and 25 percent of the silicon germanium.

11. The system of claim 10, wherein the system comprises:
an n-type metal oxide semiconductor.

12. The system of claim 11, wherein the strain-inducing layer comprises:
silicon germanium.

13. The system of claim 10, wherein the system comprises:
a p-type metal oxide semiconductor.

14. The system of claim 13, wherein the strain-inducing layer comprises:
silicon carbide.

15. The system of claim 14, wherein carbon comprises between approximately 1 and 2 percent of the silicon carbide.

* * * * *